(12) United States Patent
Hasegawa (10) Patent No.: US 6,252,797 B1
(45) Date of Patent: Jun. 26, 2001

(54) MASKED ROM AND MANUFACTURING PROCESS THEREFOR

(75) Inventor: Masahiro Hasegawa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/511,115

(22) Filed: Feb. 23, 2000

(30) Foreign Application Priority Data

Apr. 13, 1999 (JP) .................................................. 11-105492

(51) Int. Cl.[7] .................................................. G11C 11/34
(52) U.S. Cl. .............................. 365/178; 365/36; 365/181
(58) Field of Search .............................. 365/36, 178, 181, 365/173; 437/52

(56) References Cited

U.S. PATENT DOCUMENTS 5,306,657 * 4/1994 Yang ........................................ 437/52
5,406,511 * 4/1995 Nogami ................................. 365/149
5,597,753 * 1/1997 Sheu et al. ............................... 437/52

OTHER PUBLICATIONS

Patent Abstracts of Japan, No. 05291537, Nov. 5, 1993.
Patent Abstracts of Japan, No. 06310684, Nov. 4, 1994.

* cited by examiner

*Primary Examiner*—David Nelms
*Assistant Examiner*—Thong Le
(74) *Attorney, Agent, or Firm*—Nixon & Vanderhye P.C.

(57) ABSTRACT

A masked ROM of a flat cell structure has a plurality of bit-line diffusion layers formed in parallel in one direction in a semiconductor. substrate, a plurality of word lines formed on the bit-line diffusion layers orthogonally to the bit-line diffusion layers and channel regions between the bit-line diffusion layers beneath the word lines, wherein the word line is composed of a laminated layer of a first conductive layer and a second conductive layer on the channel regions and composed of the second conductive layer on the bit-line diffusion layers.

13 Claims, 6 Drawing Sheets

MASKED ROM AND MANUFACTURING PROCESS THEREFOR

CROSS-REFERENCE TO RELATED APPLICATION

This application is related to Japanese Patent Application No. HEI 11(1999)-105492 filed on Apr. 13, 1999, whose priority is claimed under 35 USC § 119, the disclosure of which is incorporated by reference in its entirety.

BACKGROUND OF THE INVENTION

1. Field of the Invention

The present invention relates to a masked ROM and a manufacturing process therefor. More particularly, the invention relates to a masked ROM having a flat-cell structure and being programmed by implantation of impurity ions, and a process for manufacturing the same.

2. Description of Related Art

Figure 10A:
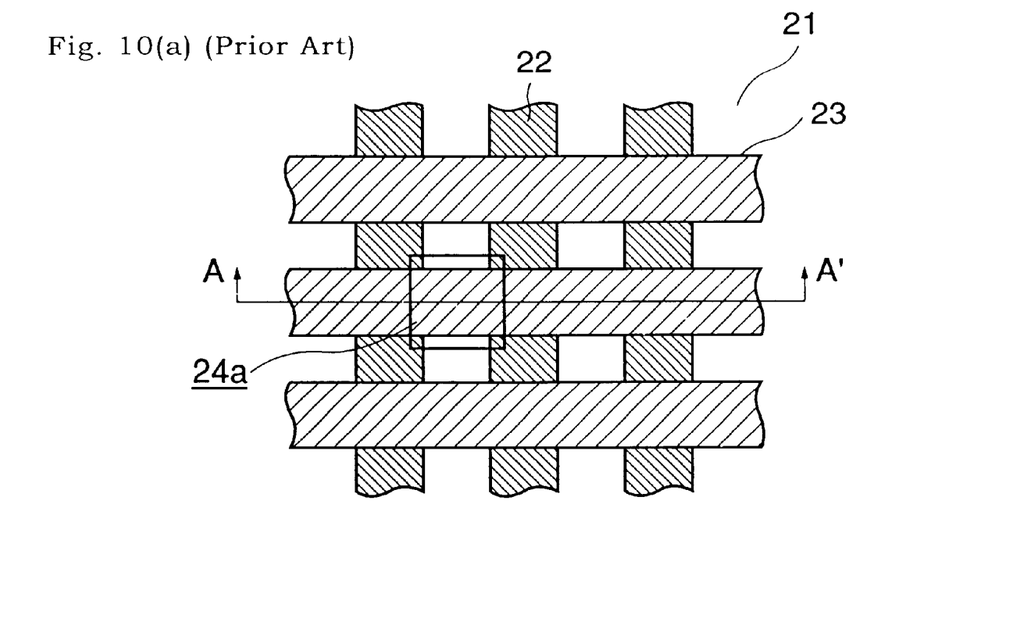
FIGS. 10(a) and 10(b) are schematic plan and sectional views, respectively, of a conventional masked ROM.
Figure 10B:
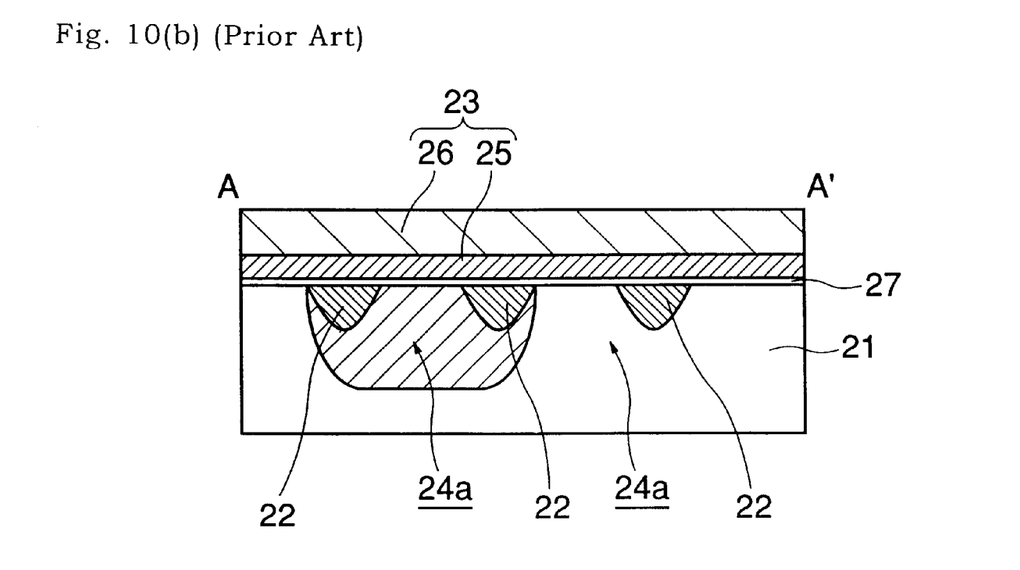

Referring to FIGS. 10(a) and 10(b), conventional masked ROMs having the flat-cell structure are constructed to have a plurality of bit-line diffusion layers 22 and a plurality of word lines 23 composed of first conductive layers 25 and second conductive layers 26. The word lines 23 are orthogonal to the bit-line diffusion layers 22.

A masked ROM having such a construction is programmed by implanting ions into channel regions 24a using a mask of a photoresist film with openings in desired regions in such a manner that the ions penetrate the word lines 23.

When boron ions are used for programming, for example, boron ions are usually implanted using a photoresist film having openings formed thereon in a size slightly larger than the channel region to be programmed, at an acceleration energy of 100 keV or more in order that boron ions penetrate the word lines. As a result, some boron ions penetrate deep into a substrate and some disperse laterally (in a direction parallel to the surface of the substrate).

Since semiconductor devices have become smaller and smaller in size and the widths of bit-line diffusion layers and channels have been reduced, there has arisen a problem that boron ions penetrate into channel regions adjacent to a channel region to be programmed due to the lateral dispersion of boron ions, which changes the threshold voltage of transistors and results in operation failure.

Boron ions, laterally dispersing, also penetrate into the bit-line diffusion layers and damage crystals in the substrate. As a result, the resistance of the bit-line diffusion layers rises and leakage at junctions increases.

Figure 11:
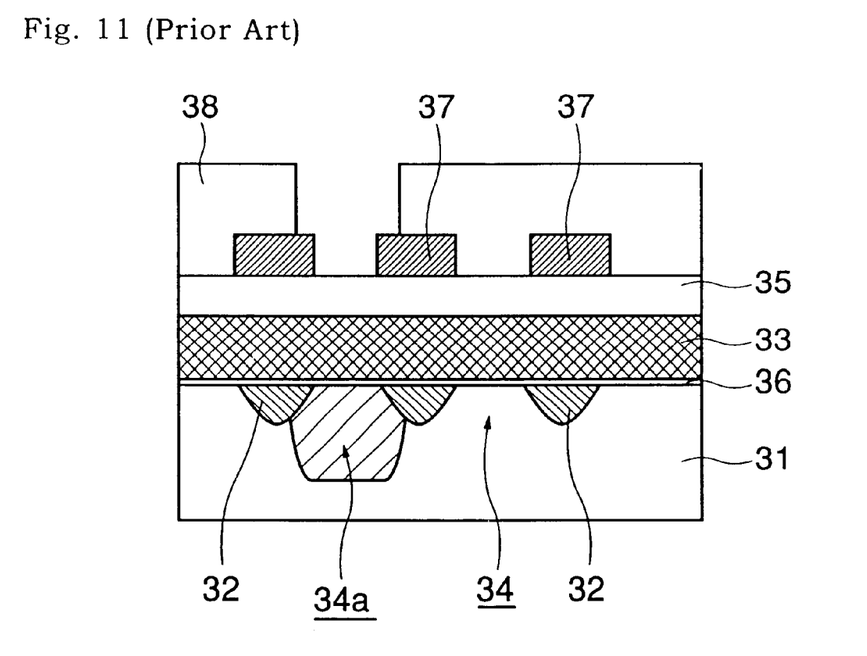
FIG. 11 is a schematic sectional view of another conventional masked ROM.

In order to solve these problems, a method illustrated in FIG. 11 is proposed (Japanese Unexamined Patent Publication No. HEI 5 (1993)-291537), for example. In this method, metal interconnects 37 which are referred to as lining interconnects are added on word lines 33 with intervention of an interlayer dielectric film 35. The word lines 33 are formed on a semiconductor substrate 31 with intervention of a gate insulator 36. The metal interconnects 37 are for reducing the resistance of bit-line diffusion layers 32. Also the metal interconnects 37, which are disposed above the bit-line diffusion layers 32 and used as masks in addition to the resist mask 38 at ion implantation for programming, prevent implanted ions from penetrating into other channel regions 34 than a channel region 34a.

Figure 12:
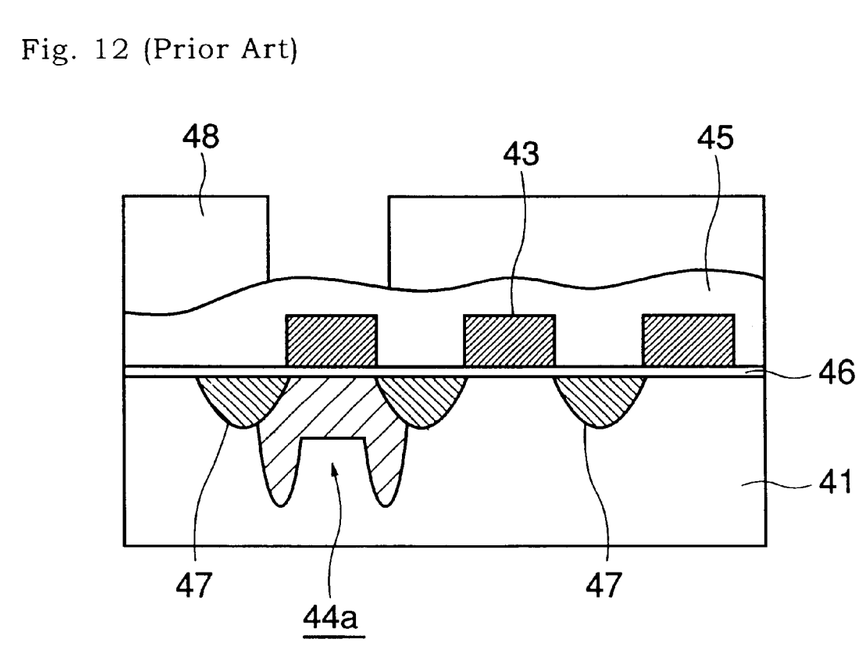
FIG. 12 is a schematic sectional view of still another conventional masked ROM.

Other methods are also proposed. Gate electrodes of polysilicon are formed in an increased thickness on a semiconductor substrate or formed to have a two-layered structure of polysilicon and tungsten silicide. Alternatively, as shown in FIG. 12, tungsten silicide, which exhibits a good barrier ability against ion implantation, is formed as word lines 43 on a semiconductor substrate 41 with intervention of a gate insulator 46. Further ion implantation is conducted at an elevated implantation energy using a resist mask 48 formed with intervention of an interlayer dielectric film 45. Thereby, in diffusion layers 47 near gate electrodes 43, ions are implanted not only in a channel region 44a near junctions of the diffusion layers 47 but also in a deeper region, so that damage to crystals at junctions of the diffusion layers 47 is avoided and leakage at the junctions are prevented (see Japanese Unexamined Patent Publication No. HEI 6(1994)-310684).

However, the method shown in FIG. 11 requires an additional step of forming the metal interconnects 37 and thereby raises production costs. If the metal interconnects 37 are formed of aluminum, the additional step is not needed because the metal interconnects can be formed by the same step of forming other interconnects. However, there arises another problem in that it becomes impossible to conduct a thermal treatment with a high temperature for activating impurities by ion implantation for programming and for recovery from crystal defect. Further there is another new problem with regard to the alignment of the metal interconnects 37 with the bit-line diffusion layers 32 when the metal interconnects 37 are formed.

As for the method shown in FIG. 12, it carries out the ion implantation for programming in a state where the gate electrodes exist only above the channel regions, it is difficult to apply this method to the flat-cell structure, in which word lines 43 are orthogonal to diffusion layers 47 and therefore the word lines 43 exist also above the diffusion layers 47.

SUMMARY OF THE INVENTION

The present invention provides a masked ROM of a flat cell structure having a plurality of bit-line diffusion layers formed in parallel in one direction in a semiconductor substrate, a plurality of word lines formed on the bit-line diffusion layers orthogonally to the bit-line diffusion layers and channel regions between the bit-line diffusion layers beneath the word lines, wherein the word line is composed of a laminated layer of a first conductive layer and a second conductive layer on the channel regions and composed of the second conductive layer on the bit-line diffusion layers.

The present invention also provides a process for manufacturing a masked ROM comprising the steps of forming a plurality of first conductive layers in parallel to each other on a semiconductor substrate; forming a plurality of bit-line diffusion layers in parallel to each other in one direction using the first conductive layers as masks; and forming, on the first conductive layers, second conductive layers having a higher barrier ability against ion implantation than the first conductive layers so that a plurality of word lines which are composed of the first and second conductive layers and are orthogonal to the bit-lines are formed.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The present invention is mainly directed to a masked ROM of the flat-cell structure having a plurality of bit-line diffusion layers in parallel in one direction within a semiconductor substrate, a plurality of word lines on the bit-line diffusion layers in an orthogonal relation thereto and channel regions between the bit-line diffusion layers beneath the word lines.

A material for the semiconductor substrate usable in the present invention is not particularly limited and may be any one that is usually used for forming semiconductor devices. For example, usable are materials known in the art, for example, semiconductors such as silicon and germanium and compound semiconductors such as GaP and GaAs. Among them, a silicon substrate is preferred. The semiconductor substrate may have one or more impurity diffusion layer(s) (wells) containing a p-type or n-type impurity formed thereon.

The bit-line diffusion layers are formed by the introduction of the p-type or n-type impurity in the surface of the semiconductor substrate and are arranged in parallel in one direction. The concentration of the impurity in the bit-line diffusion layers is not particularly limited, but may be about $10^{20}/cm^3$ to $10^{21}/cm^3$, for example. The bit-line diffusion layers may be adjusted as appropriate in their width and length depending upon desired performances of the masked ROM to be obtained. For example, the width and depth may be about 0.1 $\mu$m to about 0.5 $\mu$m and about 10 $\mu$m to about 50 $\mu$m, respectively.

The word lines are formed by depositing a conductive material in a desired configuration on the semiconductor substrate. The word lines are arranged on the bit-line diffusion layers in an orthogonal relation to the bit-line diffusion layers. Portions of the word lines on channel regions between the bit-line diffusion layers are formed in a layered structure of a first conductive layer and a second conductive layer, and portions of the word lines just on the bit-line diffusion layers are formed of the second conductive layer.

As an example of a material for the first conductive layer, polysilicon may be mentioned. Preferably a material for the second conductive layer has a greater barrier ability against ion implantation than the first conductive layer. Examples thereof include tungsten silicide, titanium silicide and cobalt silicide. So long as the second conductive layer can stop the ion implantation better than the first conductive layer, the above mentioned examples for the first and second conductive layers may be combined as appropriate for use. The thickness of the first conductive layer may be selected as suitable depending on a material chosen and may be about 50 nm to about 200 nm, for example. The thickness of the second conductive layer may be about 10 nm to about 250 nm, for example. Preferably, the shape of the first conductive layer is a rectangular solid (quadratic prism). Also the first conductive layer may be formed as a gate electrode having sidewall spacers on its sidewalls. Preferably, the second conductive layers are formed in stripes so as to fill between the first conductive layers and connect the first conductive layers. The width and length of the conductive layers may be selected as appropriate depending on desired performances of the masked ROM to be produced. For example, the first conductive layer may be about 0.1 $\mu$m to about 0.5 $\mu$m wide and about 0.1 $\mu$m to about 0.5 $\mu$m long and the second conductive layer may be about 0.1 $\mu$m to about 0.5 $\mu$m wide and about 1 mm to about 5 mm long.

The above-described masked ROM may be produced by the following manufacturing process, for example.

First, a plurality of first conductive layers are formed in parallel to each other on a semiconductor substrate. The formation of the first conductive layers may be done by forming a film of a material for the first conductive layer on an insulating film which has been deposited over the semiconductor substrate and is to function as a gate insulator, and then patterning the film of the material for the first conductive layers into a desired configuration by a photolithography and etching process. The first conductive layers are preferably formed only on regions which will be channel regions through later steps. The shape of the first conductive layers is preferably a rectangular prism because, if the first conductive layers are formed to have a trapezoidal cross section, there are problems in that the width of the bit lines decreases, which results in a rise in the resistance of the bit lines, in that the second conductive layers will not be embedded in right shape and in that it becomes difficult to form sidewall spacers. After the first conductive layers are formed, sidewall spacers may be formed on sidewalls of the first conductive layers, by forming an insulating film such a silicon oxide film, a silicon nitride film or the like on the entire surface of the resulting semiconductor substrate and etching back the insulating film. Further, in the case of forming the sidewall spacers after the formation of the first conductive layers, ion implantation may be carried out for device isolation, before or after the formation of the sidewall spacers, using a mask in a desired configuration formed by a photolithography process.

Subsequently, a plurality of bit-line diffusion layers are formed in parallel to each other in the same direction as the first conductive layers. The bit-line diffusion layers may be formed by implanting impurity ions substantially perpendicularly to the surface of the semiconductor substrate using the first conductive layers as masks, also using the sidewall spacers, if formed, as masks, and optionally using a resist mask having openings in desired regions. Here, boron ions and $BF_2^+$ may be mentioned as examples of p-type impurity ions and arsenic ions and phosphorus ions may be mentioned as examples of n-type impurity ions. Preferably, acceleration energy at this implantation is set such that ions do not penetrate (pass through) the first conductive layers, for example, about 5 keV to about 50 keV. The impurity ions may be implanted in a dose of about $1 \times 10^{15}/cm^2$ to about $3 \times 10^{15}/cm^2$. Additionally, after the ion implantation, thermal treatment may be carried out within a temperature range of about 750° C. to about 900° C. for about 10 minutes to 60 minutes for activating the implanted ions, for correcting crystal defect and the like.

Next, second conductive layers are formed on the first conductive layers. The second conductive layers have a greater barrier ability against ion implantation than the first conductive layer. The second conductive layer may be formed in a desired configuration by depositing a material for the second conductive layer on the entire surface of the semiconductor substrate obtained through the above-detailed steps; etching back the surface of the deposited material for the second conductive layer to a desired thickness, preferably flat; forming a mask having a plurality of parallel openings which are orthogonal to the bit-line diffusion layers and include the first conductive layers therein by photolithography process; and patterning the deposited material for the second conductive layer and the first conductive layer using the mask. At this time, it is preferable to deposit the material for the second conductive layers to a thickness larger than the distance between adjacent first conductive layers in a direction orthogonal to the bit-line diffusion layers. Through this process, a plurality of word lines are formed orthogonally to the bit-line diffusion layers so that the word lines are composed of the first and second conductive layers on the channel regions and to be composed only of the second conductive layers on the bit-line diffusion layers. Additionally, when the surface of the deposited material for the second conductive layer is etched back, adjustment should be made so that the thickness of the first and second conductive layer on the channel region and the thickness of the second conductive layer on the bit-line diffusion layers have optimal values. The optimal values here mean such that ions to be implanted for programming in a later step penetrate the conductive layers on the channel regions but do not penetrate the conductive layer on bit-line regions, and the optimal values vary depending on the acceleration energy, ion species an the like in the later ion implantation for programming.

After the above-described process, desired transistors are programmed. For this programming, a mask having openings above transistors desired to be programmed is formed by photolithography process, and impurity ions are implanted using the mask at an acceleration energy such that the ions penetrate the conductive layers on the channel regions but do not penetrate the conductive layer on the bit-line regions. The acceleration energy and the dose here may be about 80 keV to about 180 keV and about $1 \times 10^{14}/cm^2$ to about $3 \times 10^{14}/cm^2$, respectively, in the case of using boron ions, for example.

The process for manufacturing masked ROM of the present invention may be carried out in combination with other processes for manufacturing semiconductor devices. Also, before, during and after the above-detailed process, the deposition of an interlayer dielectric film, the formation of contact holes, metal interconnects and/or a passivation film, thermal treatment and/or the like may be carried out.

Now the masked ROM and its manufacture process of the present invention are explained in detail with reference to the accompanying drawings.

Figure 1A:
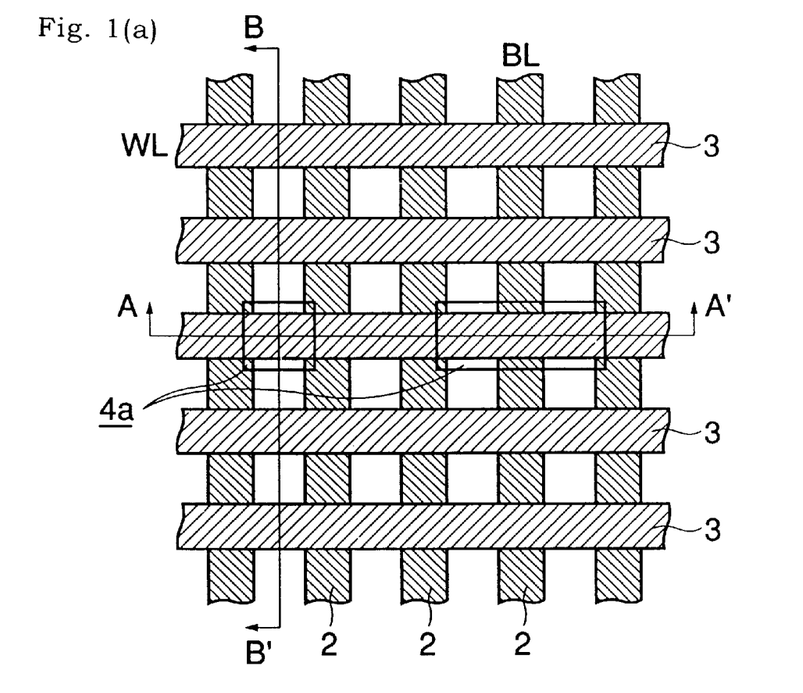
FIGS. 1(a) and 1(b) are schematic plan and sectional views, respectively, of a masked ROM in accordance with the present invention.
Figure 1B:
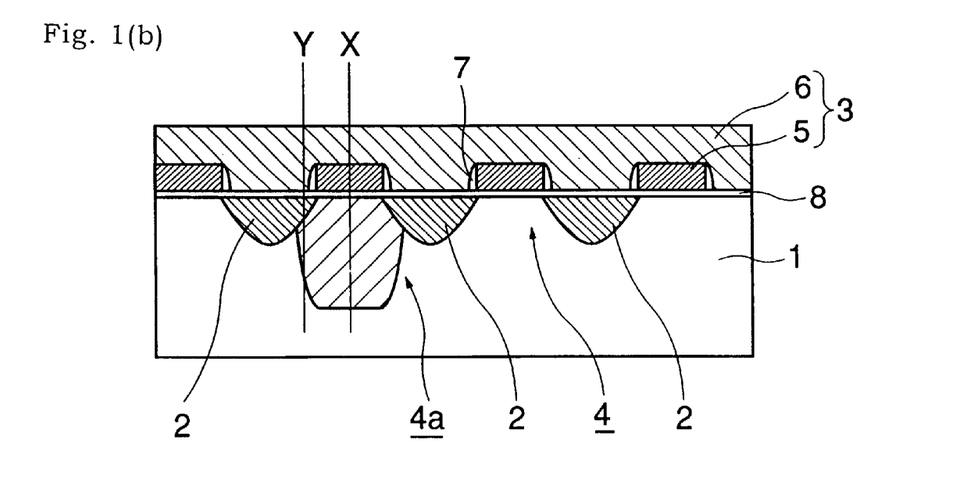

As shown in FIGS. 1(a) and 1(b), the masked ROM of the present invention is provided with a plurality of bit-line diffusion layers 2 arranged in parallel to each other on a silicon substrate 1 and a plurality of word lines 3 orthogonal to the bit-line diffusion layers 2. Channel regions 4–4a are arranged between the bit-line diffusion layers 2 beneath the word lines 3. Of these channel regions, desired channel regions 4a are programmed by implantation of boron ions. The word lines 3 are composed of both gate electrodes 5 (of polysilicon, the first conductive layers) formed on the channel regions 4–4a and tungsten silicide films 6 (the second conductive layers) formed orthogonally to the bit-line diffusion layers 2 so as to fill between the gate electrodes 5 and connect them, with intervention of gate insulating films 8. The gate electrodes 5 have sidewall spacers 7 formed on their sidewalls.

Figure 2A:
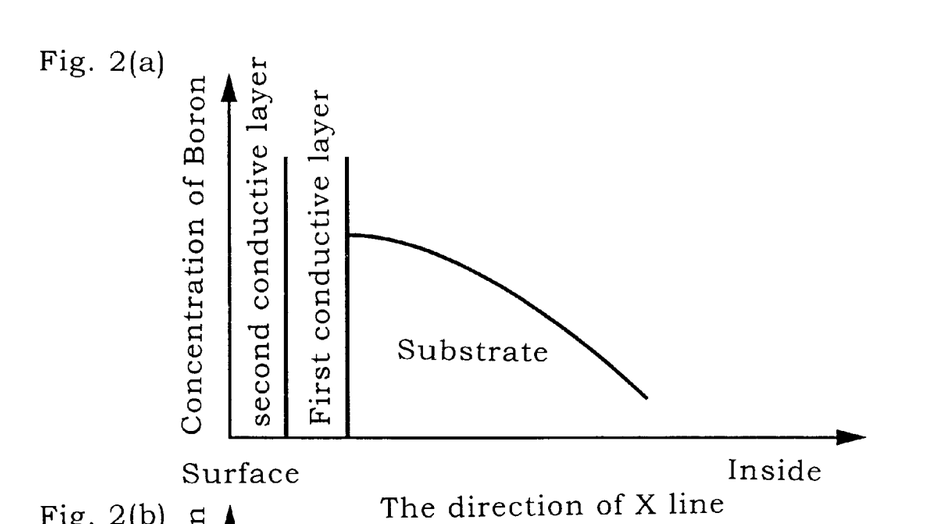
FIGS. 2(a) and 2(b) are graphical representations showing distribution of boron in directions of X and Y, respectively, of FIG. 1(b)
Figure 2B:
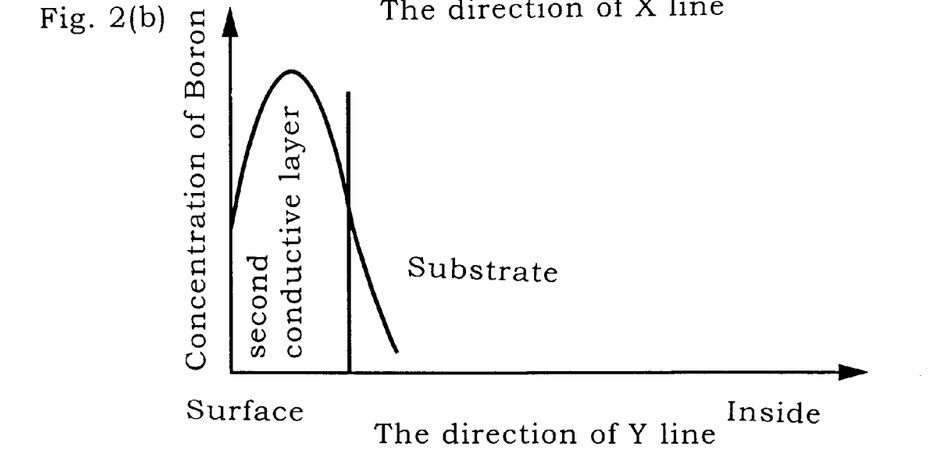

In the masked ROM thus constructed, the gate electrodes 5 of polysilicon which are the first conductive layers and the tungsten silicide films 6 which are relatively thin second conductive layers are arranged on the channel regions 4a, and relatively thick tungsten silicide films 6 are arranged on the bit-line diffusion layers. Here the tungsten silicide films 6 have a greater barrier ability against ion implantation than the gate electrodes of polysilicon as the first conductive layers. Accordingly, in the channel regions 4a (denoted by X in FIG. 1 (b)), boron ions pass through the gate electrodes 5 and the tungsten silicide films 6 and penetrate into the silicon substrate 1 as shown in FIG. 2(a). On the other hand, on the bit-line diffusion layers 2 (denoted by Y in FIG. 1(b)), boron ions can hardly pass through the thick tungsten silicide films 6 having a high barrier ability against ion implantation as shown in FIG. 2(b), and therefore, boron ions cannot penetrate in the silicon substrate 1 in such an amount that boron ions affect electric characteristics of transistors. Thus, implanted ions can be prevented from spreading laterally and from affecting adjacent transistors. Also the penetration of boron ions into the bit-line diffusion layers 2 can be reduced, and therefore, damage to the silicon substrate 1 can be suppressed. As a result, it is possible to suppress the rise of the resistance of the bit-line diffusion layers 2 and the increase of leakage at junctions due to occurrence of crystal defect. Furthermore, since additional interconnects such as lining interconnects need not be formed of aluminum, the problem regarding thermal treatment does not arise. Nor do the problems arise regarding the alignment of metal interconnects with the bit-line diffusion layers and the patterning for the metal interconnects.

The above-detailed masked ROM may be manufacture by the following manufacture process. Incidentally, FIG. 3(a) to FIG. 9(a) are sectional views taken on line A–A' of FIG. 1(a) and FIG. 3(b) to FIG. 9(b) are sectional views taken on line B–B' of FIG. 1 (b).

Figure 3A:
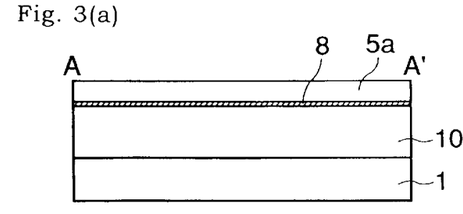
FIGS. 3(a) and 3(b) are schematic sectional views taken on lines A–A' and B–B', respectively, of FIG. 1(a), illustrating a stage of a production process.
Figure 3B:
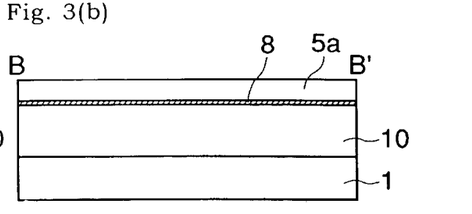

First, as shown in FIGS. 3(a) and 3(b), a p-type well 10 is formed in a silicon substrate 1 and then a gate insulating film 8 of about 7 nm thickness and a polysilicon film 5a of about 150 nm thickness are formed on the entire surface of the silicon substrate 1, using usual methods.

Figure 4A:
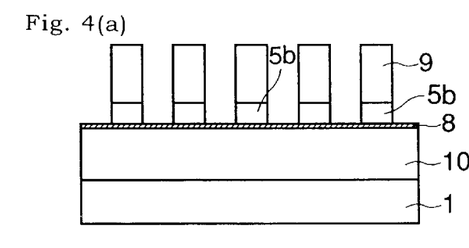
FIGS. 4(a) and 4(b) are schematic sectional views taken on lines A–A' and B–B', respectively, of FIG. 1(a), illustrating a stage of the production process.
Figure 4B:
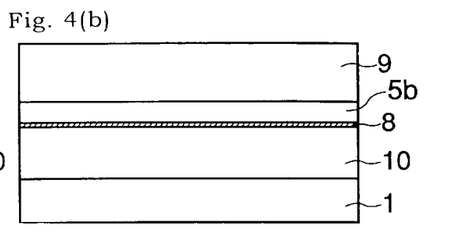

Subsequently, as shown in FIGS. 4(a) and 4(b), a resist pattern 9 is formed in a desired configuration for patterning the polysilicon film 5a by a photolithography and etching process. Using the resulting resist pattern 9 as a mask, the polysilicon film 5a is etched in a rectangular shape by a RIE method to form gate electrodes 5b. These gate electrodes 5b also have a function as a mask at ion implantation for forming bit-line diffusion layers 2 in a later step.

Figure 5A:
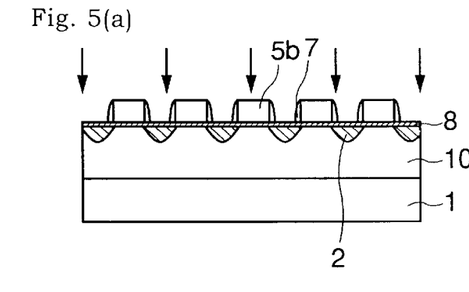
FIGS. 5(a) and 5(b) are schematic sectional views taken on lines A–A' and B–B', respectively, of FIG. 1(a), illustrating a stage of the production process.
Figure 5B:
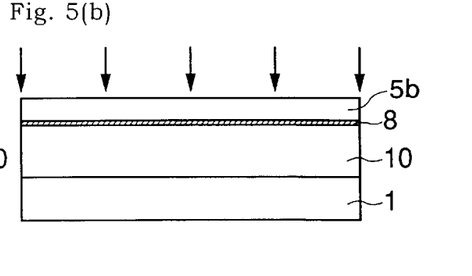

The resist pattern 9 is removed, and then, as shown in FIG. 5(a) and 5(b), a silicon oxide film of about 50 nm thickness is deposited, followed by etch-back, thereby to form sidewall spacers 7 on sidewalls of the gate electrodes 5b. Subsequently, using the gate electrodes 5b and the sidewall spacers 7 as masks, arsenic ions are implanted at 30 keV in a dose of $3\times10^{15}/cm^2$. For activation of the ions and restoration of crystals, annealing is conducted at 800° C. for 60 minutes. Bit-line diffusion layers 2 are thus formed. The sidewall spacers 7 can reduce arsenic ions entering under the gate electrodes 5b at the ion implantation and therefore lengthen an effective channel length.

Subsequently, a tungsten silicide film 6a of about 300 nm to about 400 nm thickness is deposited for the formation of interconnects for the gate electrodes 5b and etched back by a dry etching technique so that the tungsten silicide film 6a on the gate electrodes 5b is about 100 nm thick and that on the bit-line diffusion layers 2 is about 250 nm thick. In this step, it is required to adjust the thickness of the gate electrodes 5b and the tungsten silicide film 6 to the optimal values. More particularly, the optimal values should be so selected that, at the ion implantation for programming in a later step, ions penetrate into the silicon substrate 1 beneath the gate electrodes (X) and ions 5 do not penetrate into the silicon substrate 1 (the bit-line diffusion layers 2) (Y) as shown in FIGS. 2(a) and 2(b).

Figure 6A:
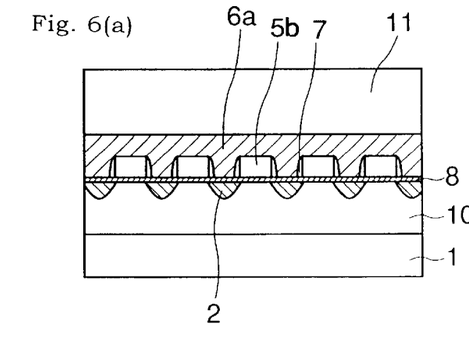
FIGS. 6(a) and 6(b) are schematic sectional views taken on lines A–A' and B–B', respectively, of FIG. 1(a), illustrating a stage of the production process.
Figure 6B:
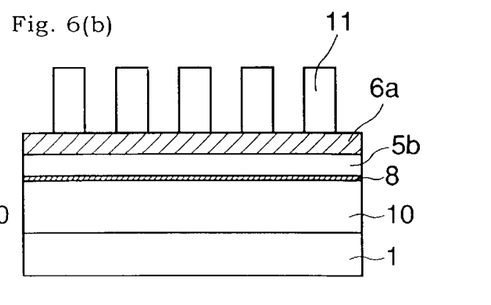

Subsequently, as shown in FIGS. 6(a) and 6(b), a resist pattern 11 is formed by a photolithography and etching process in a desired configuration for patterning the tungsten silicide film 6a. Using the obtained resist pattern 11 as a mask, the tungsten silicide film 6a and the gate electrode 5b are etched by a RIE method to form tungsten silicide films 6 and gate electrode 5 in the shape of a rectangular prism which compose the word lines 3.

Figure 7A:
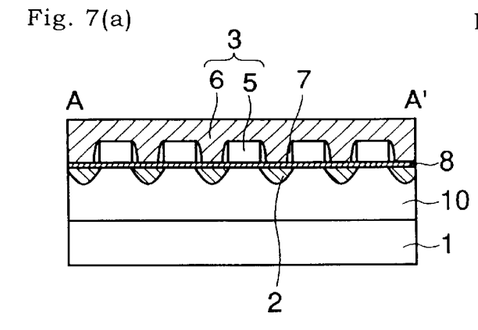
FIGS. 7(a) and 7(b) are schematic sectional views taken on lines A–A' and B–B', respectively, of FIG. 1(a), illustrating a stage of the production process.
Figure 7B:
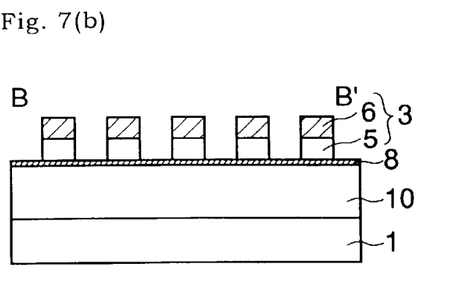
Figure 8A:
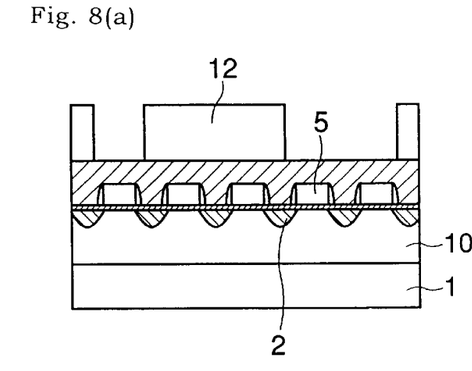
FIGS. 8(a) and 8(b) are schematic sectional views taken on lines A–A' and B–B', respectively, of FIG. 1(a), illustrating a stage of the production process.
Figure 8B:
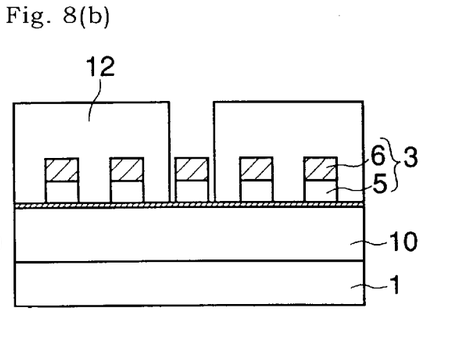

After the resist pattern 11 is removed as shown in FIGS. 7(a) and 7(b), a resist pattern 12 is formed by a photolithography and etching process in a desired configuration for implanting ions for programming as shown in FIGS. 8(a) and 8(b).

Figure 9A:
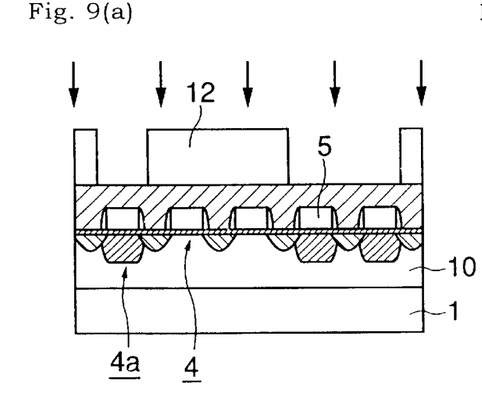
FIGS. 9(a) and 9(b) are schematic sectional views taken on lines A–A' and B–B', respectively, of FIG. 1(a), illustrating a stage of the production process.
Figure 9B:
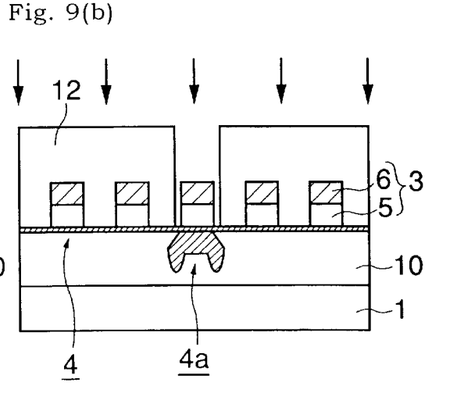

As shown in FIGS. 9(a) and 9(b), using the obtained pattern 12 as a mask, boron ions are implanted at 120 keV in a dose of $2\times10^{14}/cm^2$ for raising the threshold value of desired transistors.

Generally, the barrier ability against boron implantation of tungsten silicide is about two times higher than that of polysilicon. If boron ions are implanted at an acceleration energy of about 120 keV, the projected range of boron ions in 100 nm tungsten silicide and 120 nm of polysilicon is about 250 nm. Accordingly, by the above-described implantation of boron ions, boron ions reach near the boundaries between the gate electrodes and the gate oxide film in average in areas of the two-layered structure on the channel regions in places not covered by the resist pattern 12. Thus effective programming is possible through a later thermal treatment. Further, since implanted boron ions do not disperse much in tungsten silicide films, the tungsten silicide films 6 above the bit-line diffusion layers 2 prevent boron ions from penetrating into the substrate and the boron ions hardly enter the bit-line diffusion layers 2. For this reason, damage to the bit-line diffusion lines 2 can be reduced, junction leakage can be prevented from increasing and the resistance of the diffusion layers can be kept from rising. Also penetration of boron ions into the lateral direction can be suppressed and therefore, effect on adjacent transistors can be avoided.

Thereafter, a masked ROM is completed through the deposition of an interlayer dielectric film on the resulting silicon substrate 1 and the formation of contact holes, metal interconnects, a passivation film, an opening for a pad and the like.

According to the present invention, in a masked ROM of the flat cell structure having a plurality of bit-line diffusion layers arranged in parallel in one direction on a semiconductor substrate, a plurality of word lines orthogonal to the bit-line diffusion layers, channel regions between the bit-line diffusion layers beneath the word lines, the word lines are formed of a laminated layer of the first conductive layer and the second conductive layer on the channel regions and formed of the second conductive layer on the bit-line diffusion layers. With this construction, ion implantation for programming can be optimized.

Especially, if the second conductive layer is formed of a material having a higher barrier ability against ion implantation than a material for the first conductive layer, the channel regions can be covered with the two-layered structure of materials rich and poor in the barrier ability against ion implantation and the bit-line diffusion layers can be covered with a single layer structure of the material rich in the barrier ability against ion implantation. Accordingly, impurity ions for programming can be introduced only in the channel regions but not in the bit-line diffusion layers. As a result, it is possible to reduce damage to the bit-line diffusion layers due to implanted ions, prevent an increase in junction leakage, and suppress a rise in the resistance of the bit-line diffusion layers. Consequently, masked ROMs of improved characteristics can be obtained in a good yield. Also, it is possible to prevent the penetration of impurity ions for programming into transistors adjacent to targeted transistors, thereby to avoid mis-writing. This will contributes to further miniaturization of masked ROMs.

Further, the manufacture process of the present invention hold back the increase of production costs because it is possible to produce masked ROMs without any additional steps to the conventional manufacturing process.

What is claimed is:

1. A masked ROM of a flat cell structure comprising a plurality of bit-line diffusion layers formed in parallel in one direction in a semiconductor substrate, a plurality of word lines formed on the bit-line diffusion layers orthogonally to the bit-line diffusion layers, and channel regions between the bit-line diffusion layers beneath the word lines, wherein at least one of the word lines includes a laminated layer of a first conductive layer and a second conductive layer on the channel regions and wherein the second conductive layer is on the bit-line diffusion layer.

2. A masked ROM according to claim 1, wherein the first conductive layer is in the shape of a rectangular prism.

3. A masked ROM according to claim 1, wherein the first conductive layer has a sidewall spacer on a sidewall thereof and the second conductive layer is embedded between distinct portions of the first conductive layer so as to connect the first conductive layers on the channel regions.

4. A masked ROM according to claim 1, wherein the second conductive layer is formed of a material having a higher barrier ability against ion implantation than the first conductive layer.

5. A masked ROM according to claim 1, wherein the first conductive layer is formed of polysilicon and the second conductive layer is formed of tungsten silicide.

6. The masked ROM of claim 1, wherein said second conductive layer blocks more implantation ions than said first conductive layer so that a substantial amount of said ions is blocked and does not pass through said at least one word line between the channel regions where said first and second conductive layers do not overlap.

7. The masked ROM of claim 1, wherein said first and second conductive layers do not overlap in portions of respective channel regions.

8. A process for manufacturing a masked ROM comprising the steps of:

forming a plurality of first conductive layers in a first direction and in parallel to each other on a semiconductor substrate;

forming a plurality of bit-line diffusion layers in the first direction and in parallel to each other in the same direction as the first conductive layers using the first conductive layers as masks;

forming, on the first conductive layers, second conductive layers in a second direction perpendicular to the first direction, the second conductive layers having a higher barrier ability against ion implantation than the first conductive layers so that a plurality of word lines which are composed of the first and second conductive layers and are orthogonal to the bit-lines are formed.

9. A process for manufacturing a masked ROM according to the claim 8, further comprising the step of forming sidewall spacers on sidewalls of the first conductive layers after forming the first conductive layers.

10. A process for manufacturing a masked ROM according to the claim 8, the formation of second conductive layers on the first conductive layers comprises the steps of: depositing a material for the second conductive layer on the entire surface of the semiconductor substrate; etching back the surface of the deposited material for the second conductive layer to a predetermined thickness; forming a mask having a plurality of parallel openings which are orthogonal to the bit-line diffusion layers and include the first conductive layers therein; and patterning the deposited material for the second conductive layer as well as the first conductive layer using the mask.

11. A process for manufacturing a masked ROM according to the claim 10, the surface of the deposited material for the second conductive layer is etched back so as to be flat.

12. The process of claim 8, further comprising said second conductive layers blocking sufficient ions so that during an ion implantation process a substantial amount of ions are implanted in the substrate in at least certain channel regions where the first and second conductive layers overlap and are blocked and not implanted between channel regions where the first and second conductive layers do not overlap.

13. A masked ROM comprising:

a plurality of bit-line diffusion layers formed in parallel in a semiconductor substrate in a first direction;

a plurality of word lines formed in a second direction approximately perpendicular to the first direction;

respective channel regions located between respective bit-line diffusion layers beneath respective word lines; and wherein at least one of said word lines includes: 1) a first portion including a first conductive layer and a second conductive layer overlapping one another, wherein said second conductive layer has a higher barrier ability against ion implantation than said first conductive layer, and 2) a second portion including only said second conductive layer provided at least partially at areas where said word line crosses respective bit-line diffusion layers.

* * * * *